United States Patent
Kimura (10) Patent No.: US 7,612,588 B2
(45) Date of Patent: Nov. 3, 2009

(54) POWER ON DETECTION CIRCUIT

(75) Inventor: Hiroyuki Kimura, Sendai (JP)

(73) Assignee: Freescale Semiconductor, Inc, Austin, TX (US)

( * ) Notice: Subject to any disclaimer, the term of this patent is extended or adjusted under 35 U.S.C. 154(b) by 16 days.

(21) Appl. No.: 12/037,094

(22) Filed: Feb. 26, 2008

(65) Prior Publication Data
US 2008/0218223 A1 Sep. 11, 2008

(30) Foreign Application Priority Data
Mar. 5, 2007 (JP) .............................. 2007-054341

(51) Int. Cl.
*H03L 7/00* (2006.01)
(52) U.S. Cl. ................ 327/143; 327/142; 327/198
(58) Field of Classification Search ................ 327/142, 327/143, 198
See application file for complete search history.

(56) References Cited

U.S. PATENT DOCUMENTS 6,163,585 A * 12/2000 Yamawaki et al. .......... 375/373
2005/0140406 A1 * 6/2005 Rizzo et al. ................. 327/143

FOREIGN PATENT DOCUMENTS

| JP | 2000031807 A | 1/2000 |
| JP | 2000339962 A | 12/2000 |
| JP | 2001292054 A | 10/2001 |

OTHER PUBLICATIONS

National Semiconductor, LMS33460 3V Under Voltage Detector, http://cache.national.com/ds/LM/LMS33460.pdf, Mar. 2001.

* cited by examiner

*Primary Examiner*—Lincoln Donovan
*Assistant Examiner*—Daniel Rojas
(74) *Attorney, Agent, or Firm*—Charles Bergere (57) ABSTRACT

A power on detection circuit for accurately detecting an input voltage with a simple circuit structure and reduced current consumption includes a voltage conversion circuit, which converts input voltage into current, and a latch circuit, which holds the power on detection signal. The voltage conversion circuit supplies output current to a current source and a capacitor via a connection node. The current source generates a flow of current that is proportional to the absolute temperature. When the output current of the voltage conversion circuit becomes greater than the current of the current source, the capacitor is charged and the voltage at the connection node is pulled up. A latching circuit is activated in accordance with the voltage at the connection node to output a power on detection signal.

7 Claims, 7 Drawing Sheets

POWER ON DETECTION CIRCUIT

BACKGROUND OF THE INVENTION

The present invention relates to a power on detection circuit that detects the rise of an input voltage to a fixed value.

Generally, a power on reset circuit (also referred to as power on detection circuit) generates a reset signal for initializing an internal component of a semiconductor integrated circuit, such as a flip-flop, a latch, a counter, and a register when the power goes on.

Accordingly, there have been proposals for a voltage drop detection circuit that outputs a signal in accordance with the level of a power supply voltage. For example, National Semiconductor "LMS33460 3V Under Voltage Detector", [on-line], [searched on Jan. 14, 2007], Internet <URL: http://www.national.com/ds/LM/LMS33460.pdf.> describes such a circuit. The voltage drop detection circuit includes a reference voltage power supply and a comparator to compare a divided voltage of the power supply voltage with a reference voltage and detect a voltage drop. The output of the comparator is provided to the gate terminal of an n-channel MOS transistor. This activates the MOS transistor and enables the detection of a voltage drop.

To accelerate the activation of a band gap reference circuit, a reference voltage monitor circuit that monitors a reference voltage has been proposed. For example, Japanese Laid-Open Patent Publication No. 2000-339962 (FIG. 1) describes such a circuit. The reference voltage monitor circuit described in this publication includes a band gap reference circuit. A reference voltage generation circuit generates a predetermined reference voltage from an external power supply voltage supplied from an external device. An internal voltage generation circuit generates a predetermined internal voltage from the reference voltage. A comparator compares a divided voltage of the power voltage with a reference voltage and generates a control signal for accelerating the activation of the band gap reference circuit until the potential of the reference voltage reaches a predetermined value.

Furthermore, to stabilize operation during the generation of a reset signal, a power on reset circuit that reduces current consumption after the reset signal is generated has been proposed. For example, Japanese Laid-Open Patent Publication No. 2001-292054 (FIG. 1) describes such a circuit. The power on reset circuit described in the publication includes a detection circuit and a flip-flop circuit. The detection circuit detects that the power level has risen to a predetermined value when the power goes on. The flip-flop circuit, which connects the inputs and outputs of two inverters, is operated in two stable states. The flip-flop circuit, which is initialized when the power goes on, inverts its signal when the detection level of the detection circuit reaches a predetermined value.

In the prior art, as described above, a circuit for detecting that the input voltage has become the proper voltage has been proposed. However, as described in National Semiconductor "LMS33460 3V Under Voltage Detector", accurate measurements of the input voltage would increase current consumption. In the scheme described in Japanese Laid-Open Patent Publication No. 2000-339962, the comparator of the reference voltage monitor circuit constantly consumes current. This increases current consumption. Further, questions to the detection accuracy may arise due to the comparison of the divided voltage of the power supply voltage with the reference voltage.

In the scheme described in Japanese Laid-Open Patent Publication No. 2001-292054, the detection circuit, which includes two transistors, uses the threshold value of the transistors. Thus, the detection circuit has a relatively simple circuit and reduces power consumption. However, when the threshold value of the transistors varies due to manufacturing variations or the ambient temperature, voltage detection cannot be performed accurately. Further, in a flip-flop circuit, power supply voltage (VDD) is supplied via a capacitor (C2). It is therefore assumed that the power supply voltage rises at a fixed rate or greater.

The present invention provides a power on detection circuit that accurately detects the rising of an input with a simple structure and reduced current consumption.

BRIEF DESCRIPTION OF THE DRAWINGS

The invention, together with objects and advantages thereof, may best be understood by reference to the following description of the presently preferred embodiments together with the accompanying drawings in which:

FIGS. 2(a) to 2(d) form a timing chart illustrating the operation of the power on detection circuit of FIG. 1, where

FIGS. 4(a) to 4(e) form a timing chart illustrating the operation of the power on detection circuit of FIG. 3, where

FIGS. 6(a1) to 6(b3) are diagrams illustrating the operation of a power on detection circuit according to a fourth embodiment of the present invention, where FIG. 6(a1) is a schematic circuit diagram of a voltage conversion circuit in another embodiment, FIG. 6(a2) is a chart showing the base terminal voltage, FIG. 6(a3) is a chart showing the temperature dependency of the collector voltage, FIG. 6(b1) is a schematic circuit diagram of a voltage conversion circuit of the fourth embodiment, FIG. 6(b2) is a chart showing the base terminal voltage, FIG. 6(b3) is a chart showing the temperature dependency of the collector voltage.

DETAILED DESCRIPTION OF THE PREFERRED EMBODIMENTS

One aspect of the present invention is a power on detection circuit including a converting means for converting input voltage into converted current that is proportional to an absolute temperature and outputting the converted current. A first connection node is supplied with the converted current from the converting means. A first current source is supplied with the converted current from the first connection node. The first current source generates a flow of first current that is proportional to the absolute temperature and outputs the first current at a value that is the same as the value of the converted current when the input voltage becomes equal to a target voltage. A first filter is connected to the first connection node. A latching means outputs and holds a power on detection signal corresponding to a potential at the first connection node that is generated by the first filter when the value of the first current exceeds the value of the converted current.

Other aspects and advantages of the present invention will become apparent from the following description, taken in conjunction with the accompanying drawings, illustrating by way of example the principles of the invention.

Figure 1:
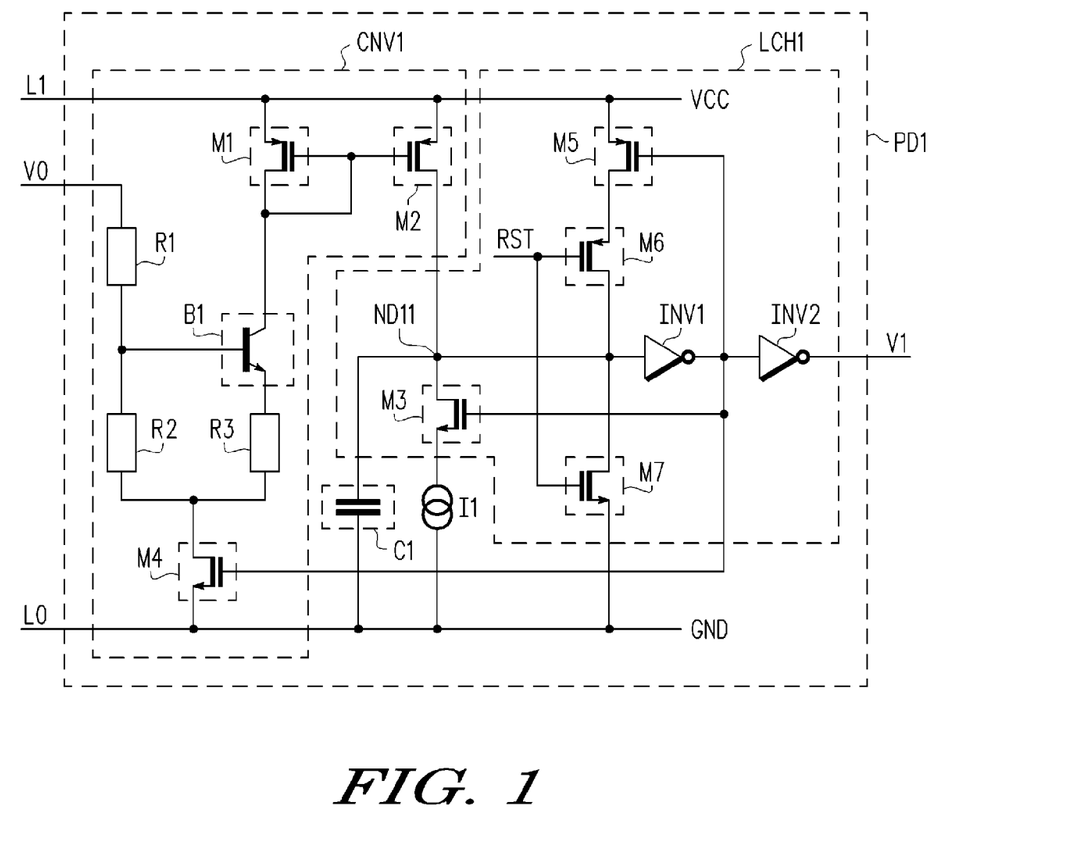
FIG. 1 is a schematic circuit diagram of a power on detection circuit according to a first embodiment of the present invention.

A power on detection circuit according to a first embodiment of the present invention will now be discussed with reference to FIGS. 1 and 2. Referring to FIG. 1, in the first embodiment, a power on detection-circuit PD1 is connected to a power supply line L1 and a ground line L0, which serves as a common line. The power supply line L1 is supplied with power supply voltage VCC. Further, the power on detection circuit PD1 is supplied with input voltage V0. The input voltage V0 is a reference voltage generated by a main reference voltage circuit.

The power on detection circuit PD1 includes a voltage conversion circuit CNV1 and a latch circuit LCH1. The voltage conversion circuit CNV1 serves as a converting means for converting voltage into current. The latch circuit LVH1 serves as a latching means for holding a power on detection signal.

Resistors R1 and R2 divide the input voltage V0 to generate voltage Vbg. The voltage Vbg is input to the base terminal of a transistor B1, which is formed by an npn bipolar transistor. The transistor B1 has a collector terminal connected to the drain and gate terminals of a transistor M1 and to the gate terminal of a transistor M2. The transistors M1 and M2 are each formed by a MOS transistor of a p-channel type (first conductive type). The source terminals of the transistors M1 and M2 are connected to the power supply line L1. The transistors M1 and M2 form a current mirror circuit.

The transistor B1 has an emitter terminal, which is connected to a resistor R3, and a base terminal, to which a bad gap voltage (or a voltage close to the band gap voltage) is applied. In this case, a proportional to absolute temperature (PTAT) current flows to the resistor R3 due to the temperature characteristics of the base-emitter voltage. Since each current source supplies PTAT current, as long as the collector current and the current of each current source is balanced at a predetermined temperature, such balanced state would be maintained at other temperatures. A slight increase of the input voltage in such a balanced state would result in the collector current becoming greater than the current of each current source regardless of the ambient temperature.

The resistors R1 and R2 are set to generate a band gap voltage serving as a target voltage when the power goes on and the input voltage V0, which serves as a reference voltage, is input. Thus, the collector current of the transistor B1 is temperature dependent.

The resistors R2 and R3 are connected to the drain terminal of a transistor M4, which is formed by a MOS transistor of an n-channel type (first conductive type). The source terminal of the transistor M4 is connected to the ground line L0.

The resistors R1, R2, and R3, the transistor B1, the transistors M1 and M2, and the transistor M4 form the voltage conversion circuit CNV1, which functions to convert the input voltage V0 to converted current (current iM2 of the transistor M2).

The output current of the voltage conversion circuit CNV1 is supplied to a current source I1, which serves as a first current source, and a capacitor C1, which serves as a first filter. More specifically, the drain terminal of the transistor M2 in the voltage conversion circuit CNV1 is connected to the capacitor C1 and the drain terminal of a transistor M3 via a first connection node ND11. The capacitor C1 provides a delay for the rising of the input voltage V0 and functions as a filter for preventing noise from causing erroneous detections when the input voltage V0 rises.

The transistor M3, which functions as a switch means for starting and stopping the supply of the converted current to the first current source, is formed by an n-channel MOS transistor. The source terminal of the transistor M3 is connected to the ground line L0 via the current source I1. The current source I1 is formed by a current proportional to absolute temperature (PTAT) circuit that generates a flow of current i1 (first current), which is proportional to the absolute temperature. Further, the current source I1 is formed so that the current i1 becomes equal to the collector current (current iM2) that flows when the voltage Vbg input to the base terminal of the transistor D1 becomes equal to the bad gap voltage. In this case, the voltage resulting from the collector current and the resistor R3 have the same temperature characteristics as the current source I1 and is not affected by ambient temperatures. Thus, the connection node ND11 functions as a point for determining the rising of voltage.

The connection node ND11 is further connected to the drain terminal of a transistor M7, which serves as a resetting means. The transistor M7 is formed by an n-channel MOS transistor. The source terminal of the transistor M7 is connected to the ground line L0.

The connection node ND11 is also connected to the power supply line L1 via two series-connected transistors M5 and M6. The transistors M5 and M6 are each formed by a p-channel MOS transistor. More specifically, the transistor M5 has a source terminal connected to the power supply line L1 and a drain terminal connected to the source terminal of the transistor M6. The drain terminal of the transistor M6 is connected to the connection node ND11.

A reset signal RST is input to the gate terminals of the transistors M6 and M7. Normally, a low level signal is input to the gates of the transistors M6 and M7, and the transistor M7 is deactivated. When resetting the power on detection circuit PD1, the reset signal RST is shifted to a high level. This deactivates the transistor M6 and activates the transistor M7.

Further, the connection node ND11 is connected to the input terminal of the inverter INV1. The output terminal of the inverter INV1 is connected to the gate terminals of the transistors M5, M3, and M4 and to the input terminal of an inverter INV2. The output of the inverter INV1 is used as a feedback signal.

An output voltage V1 at the output terminal of the inverter INV2 is output as a power on detection signal of the power on detection circuit PD1. In the first embodiment, the transistors M3, M5, M6, and M7 and the inverters INV1 and INV2 form the latch circuit LCH1.

Figure 2A:
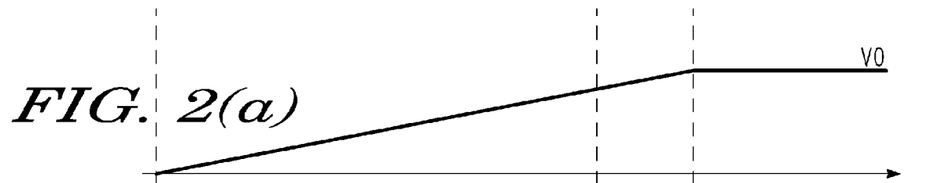
FIG. 2(a) shows the input voltage.
Figure 2B:
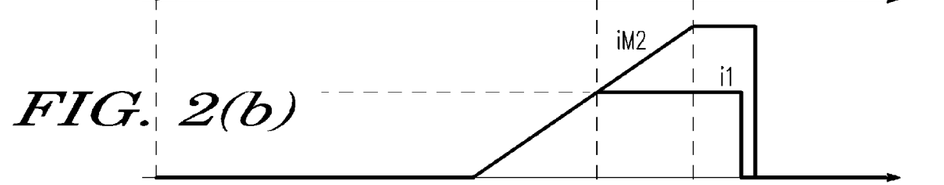
FIG. 2(b) shows the current values at a current source I1 and a transistor M2.
Figure 2C:
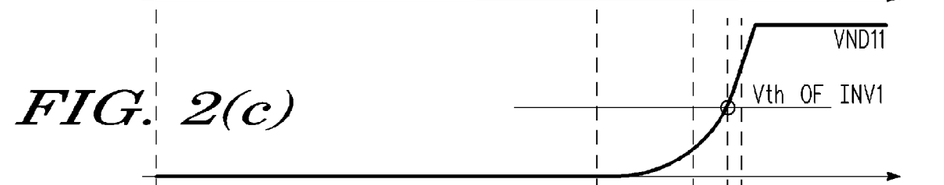
FIG. 2(c) shows the voltage at a connection node ND21.
Figure 2D:
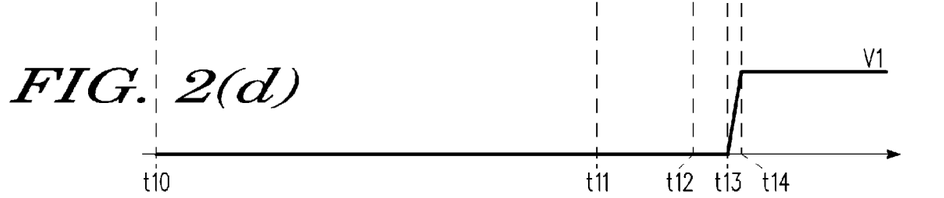
FIG. 2(d) shows the time dependency of the output voltage.

The operation of the power on detection circuit PD1 will now be described with reference to FIGS. 2(a) to 2(d). FIG. 2(a) shows the input voltage V0, FIG. 2(b) shows the currents i1 and iM2, FIG. 2(c) shows the voltage VND11 at the connection node ND11, and FIG. 2(d) shows the time dependency of the output voltage V1.

At time t10, the input voltage V0 increases from a common potential (0 V). In this case, the input voltage V0 is divided by the resistors R1 and R2, and the divided voltage is supplied to the base terminal of the transistor B1. The input voltage V0 must reach a predetermined voltage and activate the transistor B1 for current to flow to the transistor M1.

When the transistor B1 is activated, the transistor M1 starts to supply collector current. The transistor M2, which forms a current mirror circuit, starts to supply the connection node ND11 with current iM2, which has the same value as the collector current of the transistor B1.

The current iM2 is first less than the current i1 of the current source I1. Thus, the current iM2 totally flows to the ground line L0 via the current source I1. As a result, the capacitor C1 cannot be charged.

At time t11, when the current iM2 becomes greater than the current i1, surplus current (iM2−i1) is supplied to the capacitor C1 via the connection node ND11. This increases the voltage at the connection node ND11. In this state, the voltage increases along an inclination represented by the expression of [(iM2−i1)/C1].

At time t12, the power goes on and the input voltage V0 and the current iM2 take constant values.

At time t13, the voltage VND11 at the connection node ND11 exceeds the threshold value Vth of the inverter INV1. As a result, the output of the inverter INV1 shifts to a low level, and the output voltage V1 of the inverter INV2 shifts to a high level. In this state, the transistor M3 is supplied with the low level output of the inverter INV1 and deactivated. As a result, the current iM2 of the transistor M2 is totally supplied to the capacitor C1 and used to pull up the voltage at the connection node ND11.

Furthermore, the transistor M5, which is supplied with the output of the inverter INV1, is activated. This supplies voltage from the power supply line L1 to the connection node ND11 via the transistors M5 and MG.

As a result, at time t14, the voltage at the connection node ND11 is suddenly pulled up and clamped at the power supply voltage VCC. This ensures that the output voltage V1 shifts to a high level.

Additionally, the transistor M4 is supplied with the low level output of the inverter INV1 and deactivated. This stops the flow of the current iM1 from the transistor M1.

When resetting the power on detection circuit PD1, the reset signal RST is shifted to a high level. In this case, the transistor MG is deactivated and the transistor M7 is activated. Thus, the connection node ND11 shifts to a low level. As a result, the input of the inverter INV1 shifts to a low level, and the output shifts to a high level. Then, the output voltage V1 of the inverter INV2, which receives a high level signal, is shifted to a low level and reset.

The power on detection circuit of the first embodiment has the advantages described below.

(1) The temperature characteristics of a reference voltage circuit can be classified into several patterns, such as arc-shaped, S-shaped, and bent-line patterns. If the reference voltage circuit has arc-shaped characteristics and the power on detection circuit has S-shaped characteristics, the characteristics would match in some temperature ranges but differ in other temperature ranges. In the first embodiment, a band gap detection input circuit (transistors and resistors) is used in a manner equivalent to a main reference voltage circuit, and a current mirror circuit is formed by its current source. This matches the temperature characteristics of the main reference voltage circuit and the power on detection circuit in a wide temperature range and improves the power on detection accuracy. Further, power on detection can be performed with a circuit of a relatively small scale.

(2) In the first embodiment, the transistor M4, which is supplied with a low level output of the inverter INV1, is deactivated to stop the flow of the current iM1 from the transistor M1. This reduces power consumption when the power goes on.

(3) In the first embodiment, the input voltage V0 is divided by the resistors R1 and R2 to generate the voltage Vbg. The resistors R1 and R2 are set so as to generate a band gap voltage if there is an input of voltage when the power goes on at input voltage V0. In this case, the collector current I(c) is proportional to the absolute temperature. Further, the transistor M2, which forms a current mirror, supplies the current iM2, which has the same current value as the collector current I(c), to the current source I1, which is formed by a current PTAT circuit, via the connection node ND11. Thus, power on can be detected with the input voltage without being dependent on the ambient temperature.

(4) In the first embodiment, when the current iM2 becomes greater than the current i1, the surplus current (iM2−i1) is supplied to the capacitor C1 via the connection node ND11. This increases the voltage at the connection node ND11. As a result, the power on detection signal is output with a delay from the rising of the input voltage V0. If the detection voltage Vs for outputting the power on detection signal were to be lower than the final voltage Vf of the input voltage V0 by Ve, the final voltage Vf would not be reached at the time of detection. The final voltage Vf is reached when a value (time Td) obtained by dividing the difference between the final voltage Vf and the detected voltage Vs by the inclination of the input voltage elapses. In the first embodiment, due to the capacitor C1 a predetermined time Tf is required until the final voltage Vf is output. If the expression of Tf>Td is satisfied, the final voltage Vf would be reached when the power on detection signal is output. Accordingly, power on detection is ensured in this range even if the accuracy is lowered.

Further, even if noise is superimposed on the input voltage V0, the capacitor C1 filters components of the current iM2 that reflect the noise. This prevents erroneous power on detection caused by noise.

Figure 3:
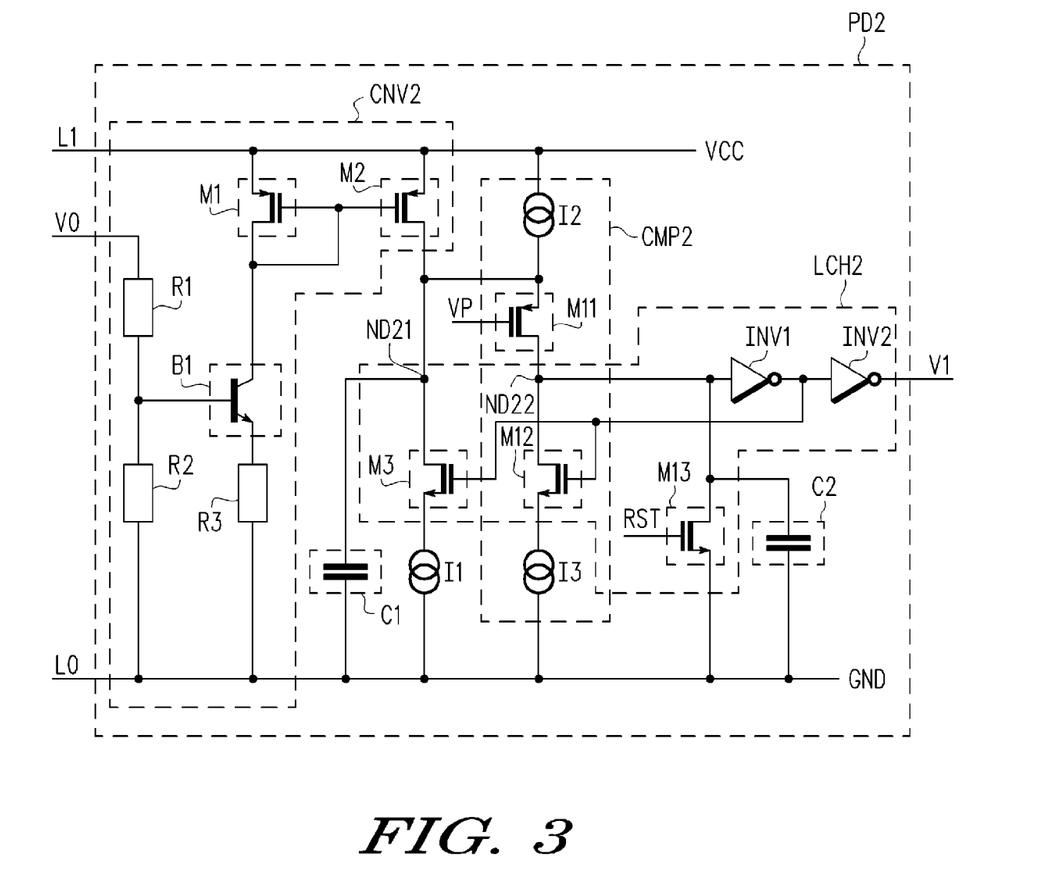
FIG. 3 is a schematic circuit diagram of a power on detection circuit according to a second embodiment of the present invention.

A second embodiment of the present invention will now be discussed with reference to FIGS. 3 and 4. The second embodiment differs from the first embodiment in that a current comparison circuit CMP2 is added to the circuit structure of the first embodiment. The other parts are the same as the first embodiment and thus will not be described in detail.

In the second embodiment, a power on detection circuit PD2 includes a voltage conversion circuit CNV2, a latch circuit LCH2, and the current comparison circuit CMP2. The voltage conversion circuit CNV2 serves as a converting means for converting voltage to current. The latch circuit LCH2 serves as a latching means for holding a power on detection signal. The current comparison circuit CMP2 serves as a current comparator.

The voltage conversion circuit CNV2 has a structure that is in correspondence with the voltage conversion circuit CNV1 of the first embodiment. However, the voltage conversion circuit CNV2 of the second embodiment does not include the transistor M4 of the voltage conversion circuit CNV1.

In the same manner as in the first embodiment, the drain terminal of the transistor M2 in the voltage conversion circuit CNV2 is connected to the drain terminal of the transistor M3 and the capacitor C1 via a connection node ND21 (corresponding to the connection node ND11 of the first embodiment), which serves as a first connection node. The source terminal of the transistor M3 is connected to the ground line L0 via the current source I1.

Further, the connection node ND21 is connected to a connection node in the current comparator between the source terminal of a transistor M11, which serves as a switch element, and a current source I2, which serves as a second current source. The current source I2 is connected to the power supply line L1 and generates current i2 (corresponding to second current value). The transistor M11 is formed by a p-channel MOS transistor. The gate terminal of the transistor M11 is supplied with voltage VP.

The drain terminal of the transistor M11 is connected to the drain terminal of a transistor M12 via a connection node ND22, which serves as a second connection node. The transistor M12 is formed by an n-channel MOS transistor. The source terminal of the transistor M12 is connected to the ground line L0 via a constant current source I3, which serves as a third current source. The value of the current i2 of the constant current source I2 and the value of the current i3 of the constant current source I3 (corresponding to third current value) are the same and smaller than the value of the current i1 of the current source I1.

The connection node ND22 is connected to the input terminal of the inverter INV1. The output terminal of the inverter INV1 is connected to the gate terminals of the transistors M3 and M12 and the input terminal of the inverter INV2.

Further, the connection node ND22 is connected to the drain terminal of a transistor M13, which serves as a resetting means, and a capacitor C2, which serves as a second filter. The transistor M13 is formed by an n-channel MOS transistor. The transistor M13 has a source terminal connected to the ground line L0 and a gate terminal that receives a reset signal RST.

In the second embodiment, the transistors M11 and M12 and the constant current source I2 and I3 form the current comparison circuit CMP2.

Figure 4A:
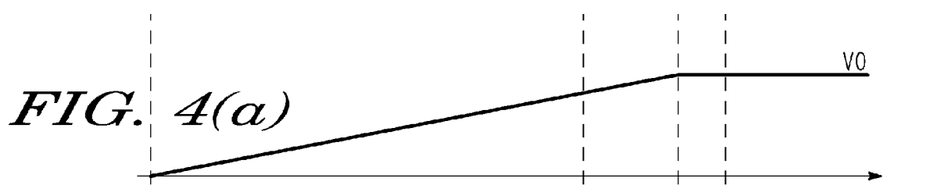
FIG. 4(a) shows the input voltage.
Figure 4B:
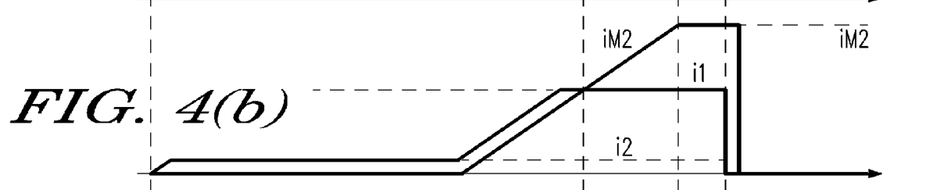
FIG. 4(b) shows the current values at a current source I1 and a transistor M2.
Figure 4C:
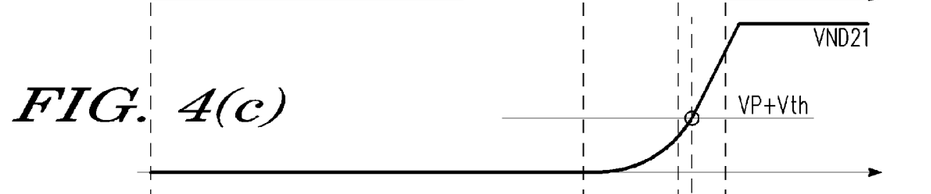
FIG. 4(c) shows the voltage at a connection node ND21.
Figure 4D:
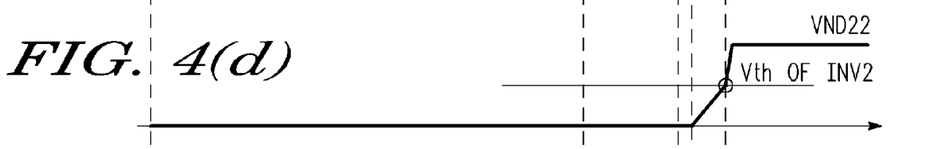
FIG. 4(d) shows the voltage at a connection node ND22.
Figure 4E:
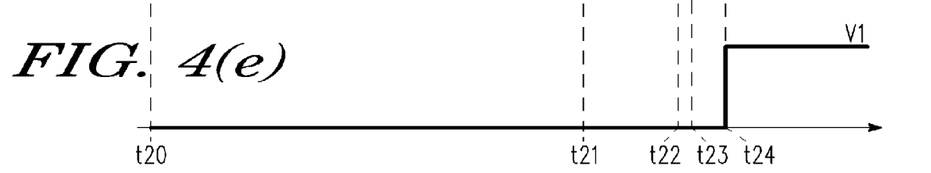
FIG. 4(e) shows the time dependency of the output voltage.

The operation of the power on detection circuit PD2 will now be discussed with reference to FIGS. 4(a) to 4(e). FIG. 4(a) shows the input voltage V0, FIG. 4(b) shows the currents i1 and im2, FIG. 4(c) shows the voltage VND21 at the connection node ND21, FIG. 4(d) shows the voltage VND22 at the connection node ND22, and FIG. 4(e) shows the time dependency of the output voltage V1.

When the current i2 of the constant current source I2 and the current i3 of the constant current source I3 are the same and smaller than the current i1 of the current source I1, the current i2 of the constant current source I2 flows to the ground line L0 via the current source I1 in the power on detection circuit PD2 until power on is detected with the input voltage.

At time t20, the input voltage V0 increases from zero volts. In the same manner as in the first embodiment, when the on voltage of the transistor B1 is exceeded, the transistor M1 starts to generate a flow of collector current. Further, the transistor M2, which forms a current mirror, starts to supply the connection node ND21 with the current iM2, which has the same value as the collector current of the transistor B1.

At time t22, the power goes on and the input voltage V0 and the current iM2 become constant.

At time t23, when the voltage VND21 at the connection node ND21 exceeds the sum of the voltage VP and threshold voltage Vth of the transistor M11 (Vp+Vth), the transistor M11 is activated. In this case, the synthesized current of the current from the connection node ND21 (iM2−i1) and the current i2 is supplied to the constant current source I3. As a result, current, which is expressed by (iM2+i2−i1−i3)=(IM2−i1), is supplied to the capacitor C2 via the connection node ND22. This increases the voltage VND22 at the connection node ND22. In this state, the voltage increases along an inclination represented by the expression of [(iM2−i1)/C2]. When the capacitor C2 is small, the voltage is suddenly pulled up.

At time t24, when the voltage VND22 at the connection node ND22 exceeds the threshold voltage Vth of the inverter INV1, the output of the inverter INV1 shifts to a low level.

In this state, the transistor M3, which is provided with the low level output of the inverter INV1, is deactivated. As a result, the current iM2 of the transistor M2 is totally supplied to the capacitor C2 and used to pull up voltage at the connection node ND22.

Furthermore, the transistor M12, which is supplied with the low level output of the inverter INV1, is activated. As a result, the voltage VND22 at the connection node ND22 is suddenly pulled up and clamped at the power supply voltage VCC.

In addition to advantages (1), (3), and (4) of the first embodiment, the second embodiment has the advantages described below.

(5) In the second embodiment, the transistors M3, M11, and M12 and the constant current sources I2 and I3 form the current comparison circuit CMP2. Further, after the voltage VND21 at the connection node ND21 rises, the voltage VND22 at the connection node ND22 rises and charges the capacitor C2. This outputs the power on detection signal with a delay from the rising of the input voltage V0. Accordingly, power on detection is output after the delay produced by a filter (capacitors C1 and C2) even if the accuracy of a reference voltage for detecting the rising of the input voltage is lowered within a range that does not exceed the voltage subsequent to power on. Thus, power on detection is accurately performed.

(6) In the second embodiment, the capacitor C2 may be reduced in scale so that the voltage VND22 at the connection node ND22 rapidly rises. By shortening the time during which the voltage VND22 input to the inverter INV1 varies, power consumption can be reduced at the inverter INV1.

Figure 5:
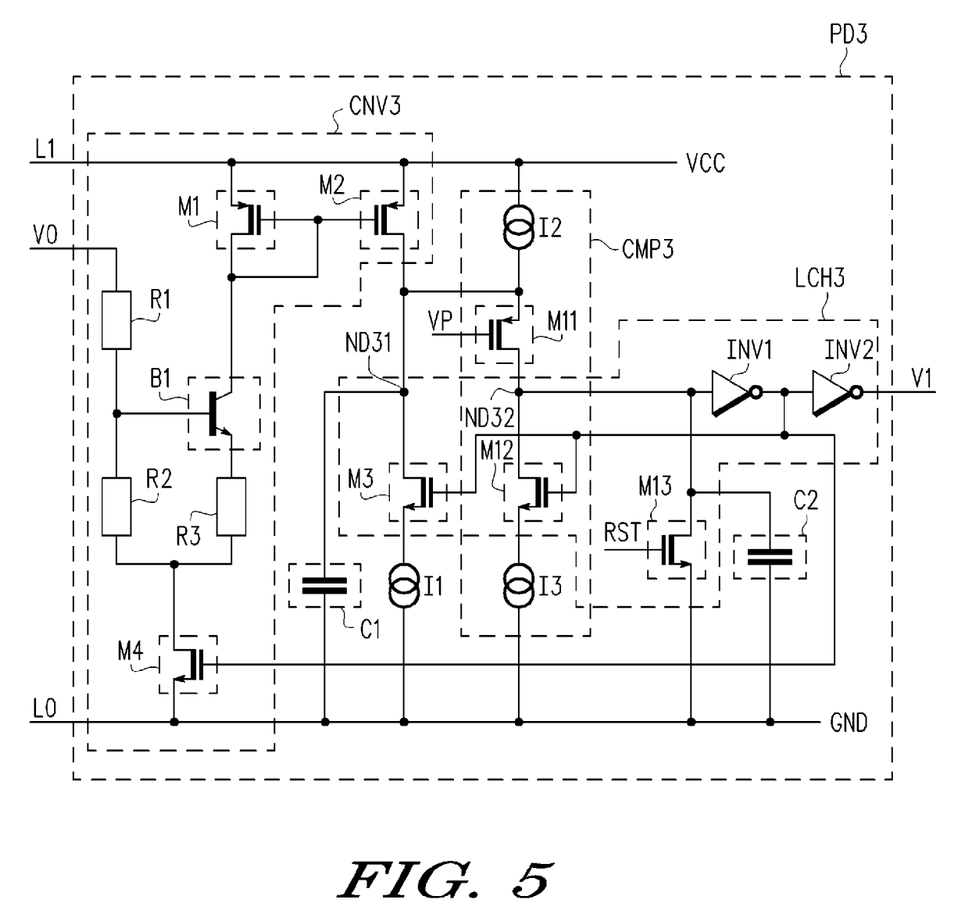
FIG. 5 is a schematic circuit diagram of a power on detection circuit according to a third embodiment of the present invention.

A third embodiment of the present invention will now be discussed with reference to FIG. 5. The third embodiment differs from the second embodiment in that the transistor M4 of the first embodiment is added to the voltage conversion circuit CNV2 of the second embodiment to form a voltage conversion circuit CNV3, which serves as a converting means. The other parts are the same as the second embodiment and thus will not be described in detail. In the third embodiment, a power on detection circuit PD3 includes a current comparison circuit CMP3, which serves as a current comparator, and a latch circuit LCH3, which serves as a latching means. The current comparison circuit CMP3 and the latch circuit LCH3 respectively correspond to the current comparison circuit CMP2 and the latch circuit LCH2 of the second embodiment. Further, a connection node ND31, which serves as a first connection node, and a connection node ND32, which serves as a second connection node, respectively correspond to the connection nodes ND21 and ND22 of the second embodiment.

In the third embodiment, the output terminal of the inverter INV1 is connected to the gate terminals of the transistors M3, M4, and M12.

In addition to the advantages of the second embodiment, the power on detection circuit PD3 of the third embodiment has the advantages described below.

In the third embodiment, when the input voltage causes the power to go on, the low level output of the inverter INV1 is provided to the gate terminal of the transistor M4. This deactivates the transistor M4 and stops the flow of current iM1 in the transistor M1. As a result, power consumption is reduced.

A fourth embodiment of the present invention will now be discussed with reference to FIGS. 6 and 7. The fourth embodiment differs from the third embodiment only in that a voltage conversion circuit CNV5 is formed by simplifying the voltage conversion circuit CNV3 of the third embodiment. The other parts are the same as the third embodiment and thus will not be described in detail.

In the fourth embodiment, a power on detection circuit PD5 includes the current comparison circuit CMP5 and a latch circuit LCH5, which respectively correspond to the current comparison circuit CMP3 and the latch circuit LCH3 of the third embodiment. Further, a connection node ND51, which serves as a first connection node, and a connection node ND52, which serves as a second connection node, respectively correspond to the connection nodes ND31 and ND32 of the third embodiment.

Figure 6:
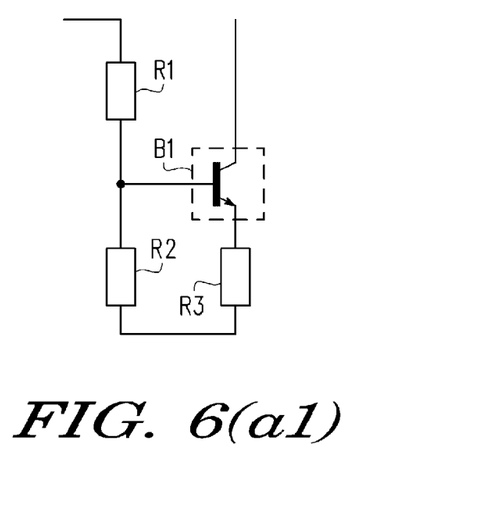
Figure 7:
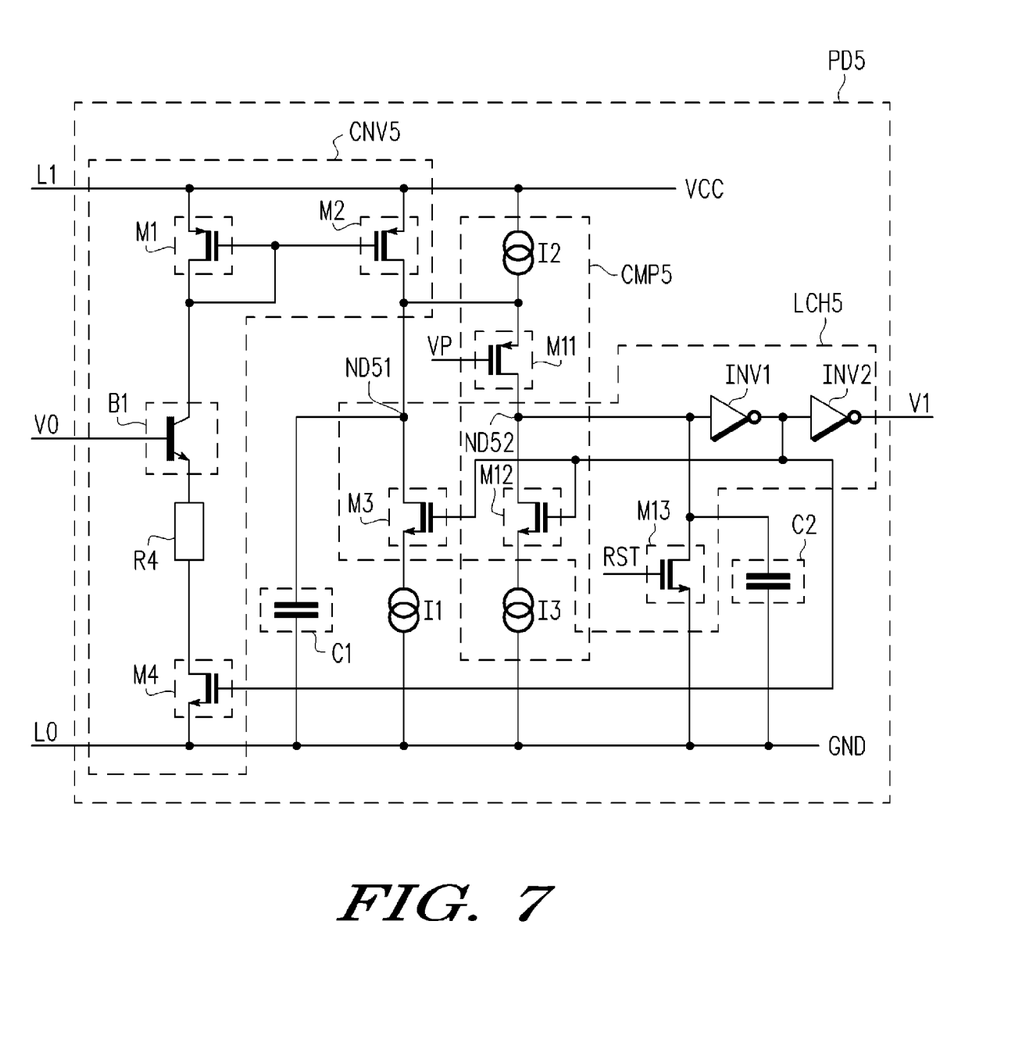
FIG. 7 is a schematic circuit diagram of the power on detection circuit of a fourth embodiment of the present invention.

Referring to FIG. 6(a1), in the circuit of the second embodiment, the resistors R1, R2, and R3 are used so that the voltage Vbg becomes equal to the sum of the base-emitter voltage VBE of the transistor B1 and the voltage VR3 of the resistor R3. This equalizes the input voltage V0 and the voltage Vbg and cancels the temperature dependency of the voltage Vbg as shown in FIG. 6(a2). In this case, the collector current of the transistor B1 has a temperature dependency as shown in FIG. 6(a3) and becomes equal to the current i1 of the current source I1.

As shown in FIG. 6(b1), a resistor R4, which is smaller than the resistor R3, is connected to the emitter terminal of the transistor B1, and the base terminal of the transistor B1 is supplied with the input voltage V0. In this case, when using the same collector current (current i1 of the current source I1) as shown in FIG. 6(b3), the sum of the base-emitter voltage VBE of the transistor B1 and the voltage VR5 of the resistor R4 becomes smaller than the band gap voltage and thus temperature dependent. However, the current consumption of the resistors R1 and R2 can be reduced.

Accordingly, such a structure is applied to the voltage conversion circuit CNV3 of the third embodiment to form the voltage conversion circuit CNV5 in the power on detection circuit PD5.

In addition to advantages (1), (2), and (4) of the first embodiment and the advantages (5) and (6) of the second embodiment, the power on detection circuit PD5 of the fourth embodiment has the advantages described below.

In the fourth embodiment, the resistor R4 is connected to the emitter terminal of the transistor B1, and the base terminal of the transistor B1 is supplied with the input voltage V0. Thus, the rising of the input voltage V0 is detected slightly before the transistor B1 goes on. The voltage rising can also be detected with a comparator as in the prior art. However, this has a problem in that the comparator must be supplied with a reference voltage. More specifically, the reference voltage would be generated by a band gap circuit. Thus, the rising of the reference voltage (main reference voltage) would have to be checked. This would result in the need for a further reference voltage. In this case, the following conditions would be required.

(A) The further reference voltage always rises before the main reference voltage.

(B) Accuracy (especially, responsiveness) that prevents erroneous detections. In other words, the absolute error of a reference voltage circuit and a detection circuit may be large. However, it is preferred that the relative error be as small as possible.

Accordingly, in the fourth embodiment, the functions of a main reference voltage circuit are used to obtain the necessary functions with a simple structure.

(a) The band gap circuit first generates monitor current in correspondence with the voltage rising. Then, monitor voltage is generated based on the monitor current. A load capacitor is connected to the output of a reference voltage source. Thus, the rising of the monitor voltage is detected after the monitor current rises.

(b) The voltage conversion circuit CNV1 (transistors and resistors) is used as an equivalent to the main reference voltage circuit to extract current from the voltage conversion circuit CNV1. This equalizes the temperature dependency in a wide temperature range.

It should be apparent to those skilled in the art that the present invention may be embodied in many other specific forms without departing from the spirit or scope of the invention. Particularly, it should be understood that the present invention may be embodied in the following forms.

The power on detection circuit PD1 of the first embodiment includes the voltage conversion circuit CNV1, which converts voltage to current, and the latch circuit LCH1, which holds a power on detection signal. The power on detection circuit PD3 of the third embodiment includes the voltage conversion circuit CNV3, which converts voltage into current, a latch circuit LCH4, which holds a power on detection signal, and a current comparison circuit CMP3. These two power on detection circuits PD1 and PD3 may be combined with each other. More specifically, the transistors M5 and M6 may be arranged between the power supply line L1 and the connection node ND22 to increase the pull up rate of the voltage VND32.

The power on detection circuit PD5 of the fourth embodiment includes the current comparison circuit CMP5 and the latch circuit LCH5, which respectively correspond to the current comparison circuit CMP3 and the latch circuit LCH3 of the third embodiment. Instead, the latch circuit LCH1 of the first embodiment may be used.

The power on detection circuit PD5 of the fourth embodiment includes the transistor. M4. However, the transistor M4 may be eliminated. This would increase current consumption in the voltage conversion circuit CNV5 but simplify the circuit structure.

The present examples and embodiments are to be considered as illustrative and not restrictive, and the invention is not to be limited to the details given herein, but may be modified within the scope and equivalence of the appended claims.

The invention claimed is:

1. A power on detection circuit comprising:
a converting means for converting input voltage into converted current that is proportional to an absolute temperature and outputting the converted current;
a first connection node supplied with the converted current from the converting means;
a first current source supplied with the converted current from the first connection node, wherein the first current source generates a flow of first current that is proportional to absolute temperature and outputs the first current at a value that is the same as the value of the converted current when the input voltage becomes equal to a target voltage;
a first filter connected to the first connection node; and
a latching means for outputting and holding a power on detection signal corresponding to a potential at the first connection node that is generated by the first filter when the value of the first current exceeds the value of the converted current, wherein the latching means provides a feedback signal to the converting means when the value of the first current exceeds the value of the converted current, and the converting means stops the output of the converted current in accordance with the feedback signal.

2. The power on detection circuit according to claim 1, wherein when the value of the first current exceeds the value of the converted current, the latching means outputs the feedback signal and pulls up the potential at the first connection node in accordance with the feedback signal.

3. A power on detection circuit comprising:
a converting means for converting input voltage into converted current that is proportional to absolute temperature and outputting the converted current;
a first connection node supplied with the converted current from the converting means;
a first current source supplied with the converted current from the first connection node, wherein the first current source generates a first current that is proportional to absolute temperature and outputs the first current at a value that is the same as the value of the converted current when the input voltage becomes equal to a target voltage;
a first filter connected to the first connection node; and
a latch for outputting and holding a power on detection signal corresponding to a potential at the first connection node that is generated by the first filter when the value of the first current exceeds the value of the converted current, wherein the latch outputs a feedback signal when the value of the first current exceeds the value of the converted current, the power on detection circuit further comprising:
a switch provided with the feedback signal and arranged between the first connection node and the first current source, wherein the switch stops the supply of the converted current to the first current source in accordance with the feedback signal.

4. The power on detection circuit according to claim 1, wherein the latching means includes a resetting means for setting the potential at the first connection node to a common potential in accordance with a reset signal and stopping the output of the power on detection signal.

5. A power on detection circuit, comprising:
a voltage converter circuit for converting an input voltage into a converted current that is proportional to an absolute temperature;
a first node connected to the converter circuit and receiving the converted current;
a first current source connected to the first node and receiving the converted current, wherein the first current source generates a first current that is proportional to the absolute temperature, and wherein the first current is equal to the converted current when the input voltage equals a target voltage;
a first filter connected to the first node;
a latch circuit connected to the first filter for outputting a power on detection signal corresponding to a potential at the first node that is generated by the first filter when the value of the first current exceeds the value of the converted current;
a current comparator connected to the first node, the current comparator including a second current source suppliable with current having a second current value, a third current source for generating a current having a third current value that is smaller than the second current value, and a switch element; and
a second filter for receiving an output current of the current comparator via a second node, wherein:
the potential at the first node drives the switch element of the current comparator and supplies the third current source with synthesized current supplied from the first node and the second current source; and
the latch circuit holds the power on detection signal generated by the second filter and output in correspondence with a potential at the second node when the synthesized current exceeds the value of the third current.

6. The power on detection circuit according to claim 5, wherein the latching means includes a resetting means for setting the potential at the second connection node to a common potential in accordance with a reset signal and stopping the output of the power on detection signal.

7. The power on detection circuit of claim 5, wherein the latch circuit includes a reset circuit for setting the potential at the first node to a common potential in accordance with a reset signal and inhibiting the output of the power on detection signal.

* * * * *